(12) United States Patent
Matsui (10) Patent No.: US 6,727,868 B2
(45) Date of Patent: Apr. 27, 2004

(54) DISPLAY DEVICE FOR AN ELECTRONIC APPLIANCE

(75) Inventor: Tsuyoshi Matsui, Chiba (JP)

(73) Assignee: Seiko Instruments Inc., Chiba (JP)

( * ) Notice: Subject to any disclaimer, the term of this patent is extended or adjusted under 35 U.S.C. 154(b) by 48 days.

(21) Appl. No.: 09/783,877

(22) Filed: Feb. 15, 2001

(65) Prior Publication Data

US 2001/0024197 A1 Sep. 27, 2001

(30) Foreign Application Priority Data

Mar. 10, 2000 (JP) ........................................ 2000-066946

(51) Int. Cl.⁷ ................................................. G09G 3/00
(52) U.S. Cl. ........................ 345/30; 345/214; 345/659
(58) Field of Search ............................ 345/1.1, 1.2, 50, 345/30, 55, 38, 40, 42, 104, 659, 657; 368/10, 276, 84

(56) References Cited

U.S. PATENT DOCUMENTS

| | | | | |
|---|---|---|---|---|
| 4,064,552 A | * | 12/1977 | Angelucci et al. | 361/795 |
| 4,149,257 A | * | 4/1979 | Nakagiri et al. | 708/111 |
| 4,238,848 A | * | 12/1980 | Yamaguchi et al. | 368/276 |
| 4,268,913 A | * | 5/1981 | Nakagiri et al. | 368/10 |
| 4,462,696 A | * | 7/1984 | Yung et al. | 368/84 |
| 5,774,199 A | * | 6/1998 | Ozawa | 349/149 |
| 6,433,791 B2 | * | 8/2002 | Selli et al. | 345/659 |

FOREIGN PATENT DOCUMENTS

JP 2079317 6/1991

* cited by examiner

Primary Examiner—Steven Saras
Assistant Examiner—Fritz Alphonse
(74) Attorney, Agent, or Firm—Adams & Wilks (57) ABSTRACT

The terminals for a display content control signal or product specification control signal output by an integrated circuit for detecting a display format of a display panel are all connected to a corresponding drive pattern of a circuit board used for conveying drive signals to the display panel through a connector, so that a plurality of different types of displays may be driven without requiring different dedicated electronic circuits modified for each type of display. A plurality of different display panels each having a unique display format are prepared for use in different destinations, and the drive pattern on the display panel indicates the destination, thereby making possible to provide a display content switch section or product specification switch section within the display panel.

32 Claims, 7 Drawing Sheets

DISPLAY DEVICE FOR AN ELECTRONIC APPLIANCE

BACKGROUND OF THE INVENTION

1. Field of the Invention

Figure 1:
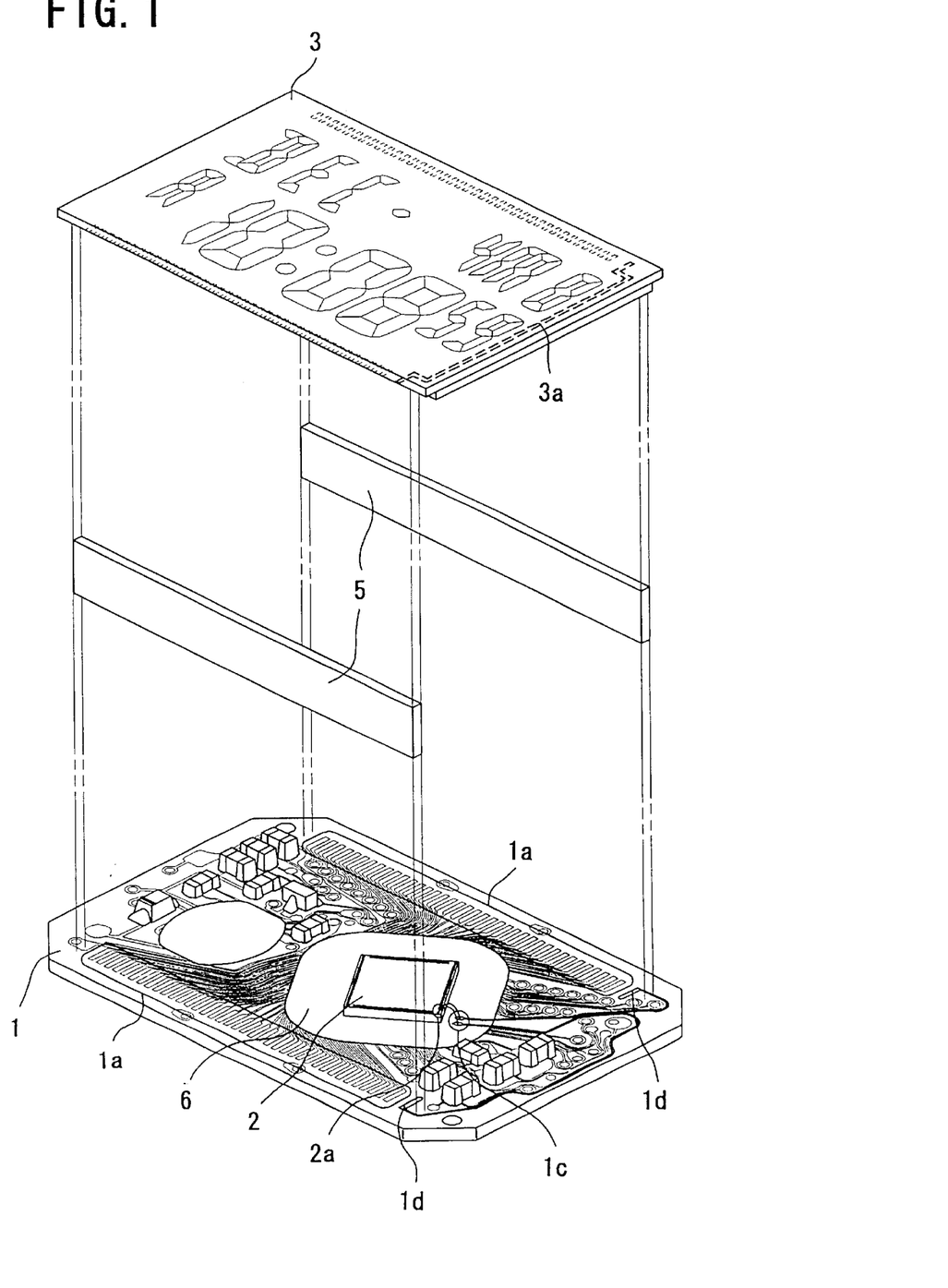
FIG. 1 is a perspective view representing an overall separation structure of a display device for an electronic appliance when mounting a lateral type display device according to the present invention.
Figure 2:
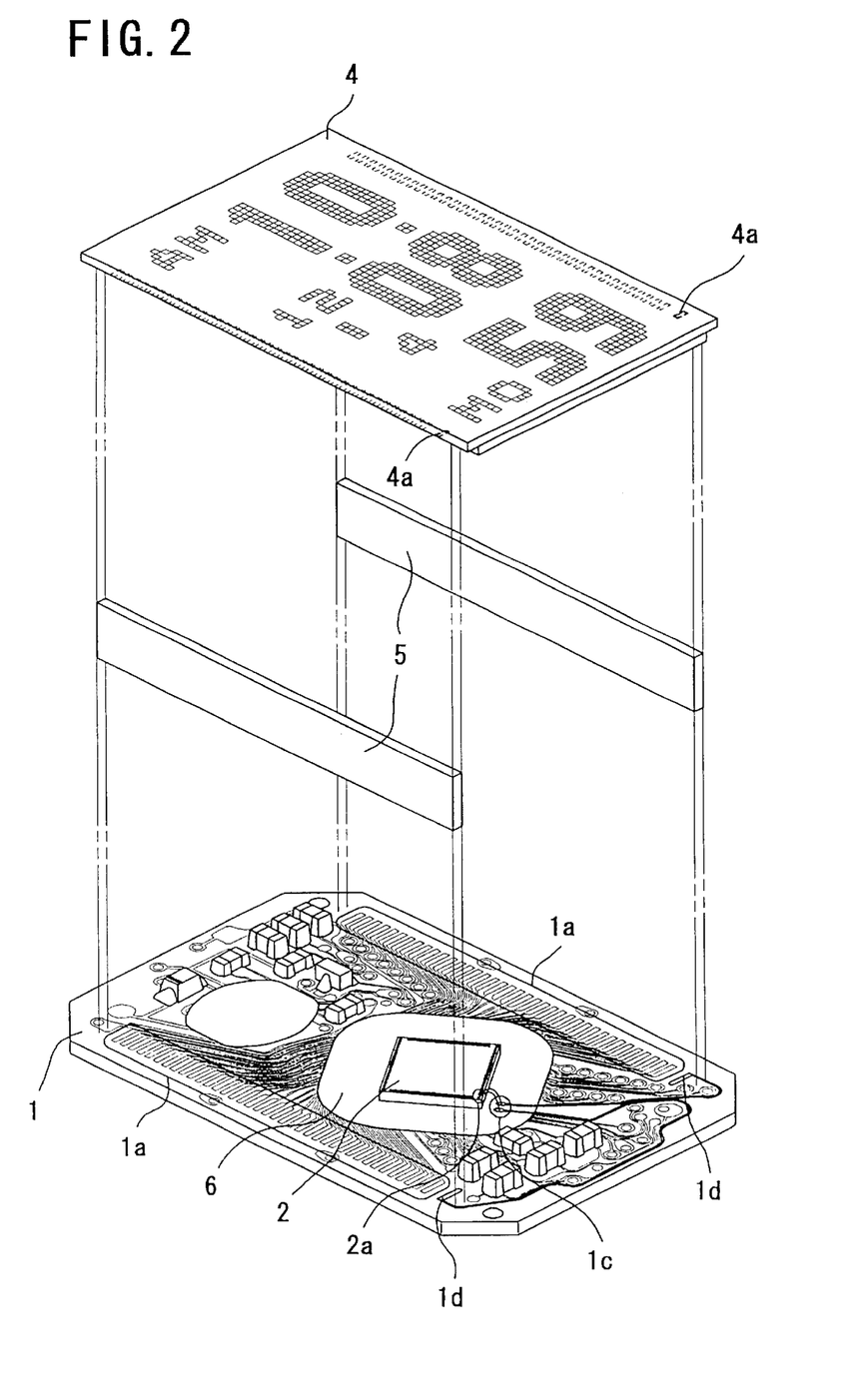
FIG. 2 is a perspective view representing an overall separation structure of a display device for an electronic appliance when mounting a vertical type display device according to the present invention.

The present invention relates, as shown in FIG. 1 and FIG. 2, to a display device for an electronic appliance capable of switching display content or product specification by remounting a display device 3 and a display device 4.

2. Description of the Prior Art

Figure 3:
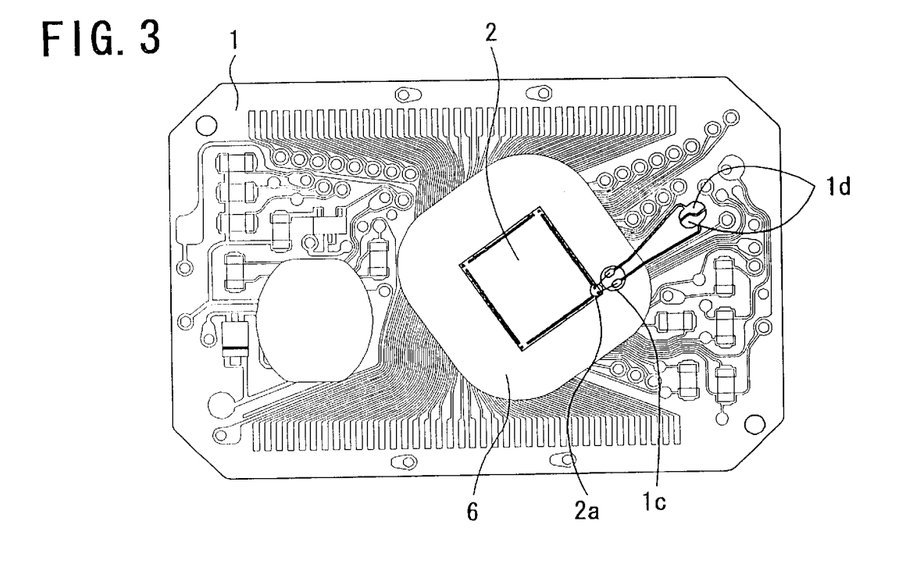
FIG. 3 is a plan view representing a pattern form of a circuit board for a display-content control switching or product-specification switching section due to soldering, showing conventional art.
Figure 4A:
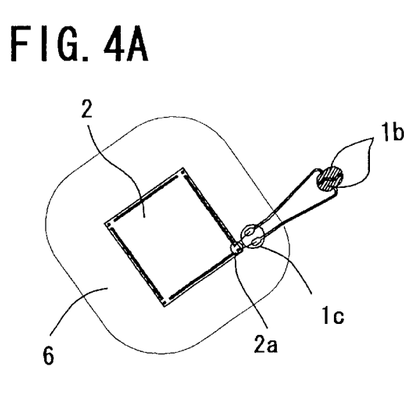
FIG. 4A is a plan view showing a short state in the display-content control switching or product-specification switching section in FIG. 3.
Figure 4B:
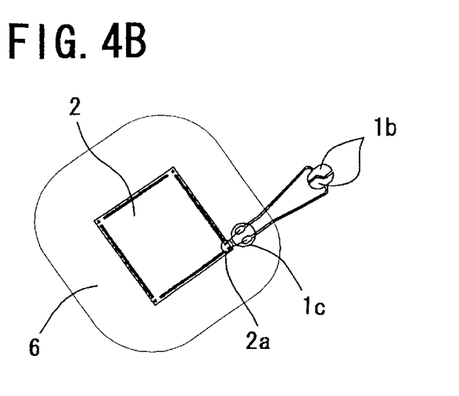
FIG. 4B is a plan view showing an open state in the display-content control switching or product-specification switching section in FIG. 3.
Figure 5A:
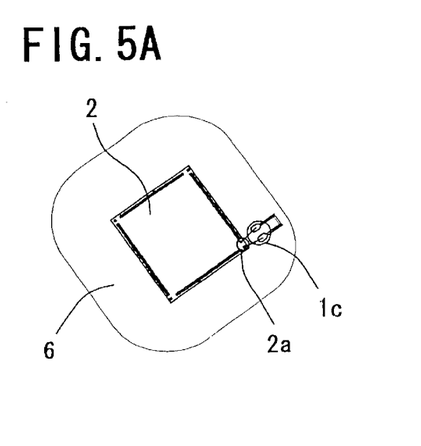
FIG. 5A is a plan view showing a short state in the display-content control switching or product-specification switching section in wire bonding, showing another conventional art.
Figure 5B:
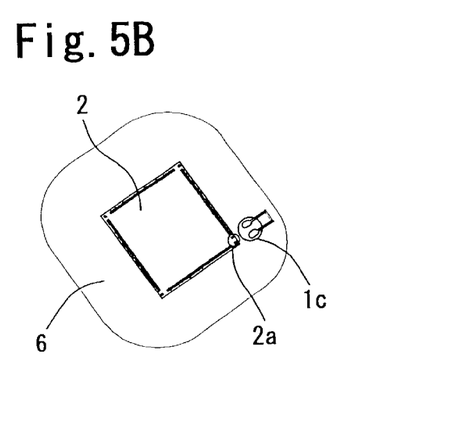
FIG. 5B is a plan view in FIG. 5A showing an open state in the display-content control switching or product-specification switching section in wire bonding.
Figure 6A:
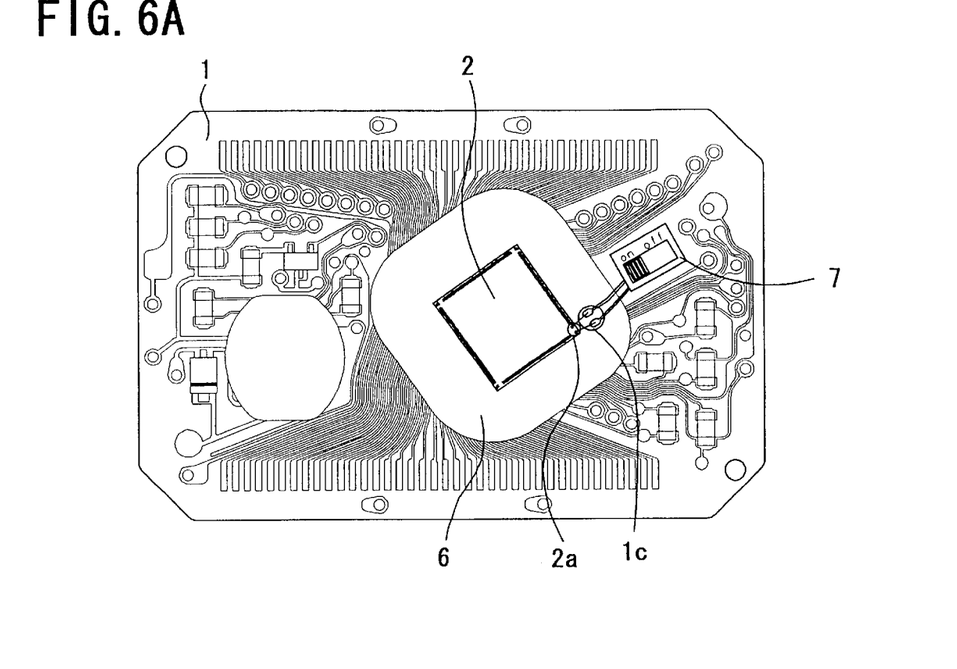
FIG. 6A is a plan view showing a short state in the display-content control switching or product-specification switching section in a switch member, showing still another conventional art.
Figure 6B:
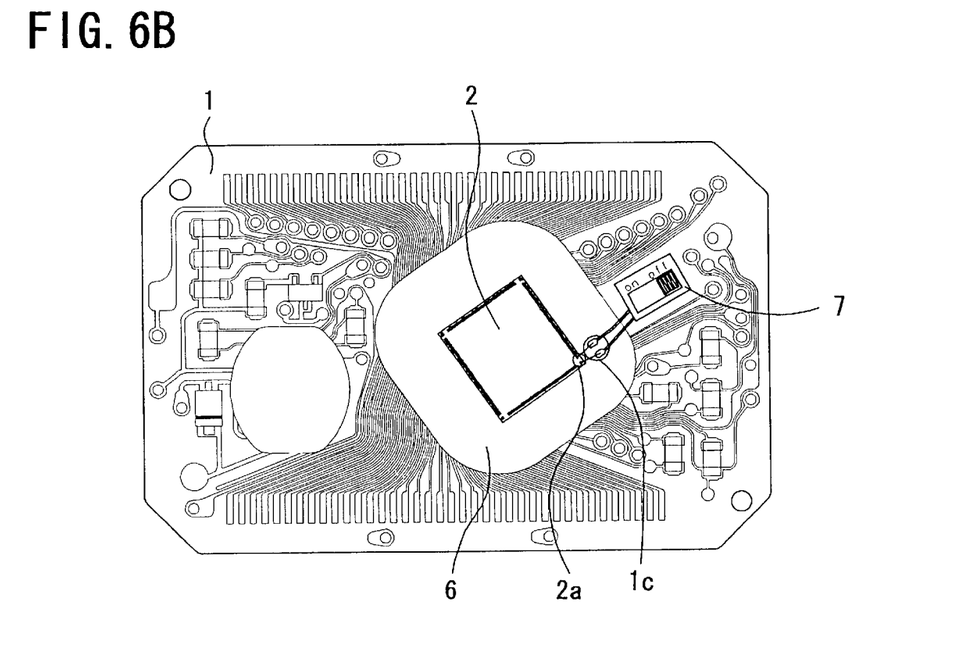
FIG. 6B is a plan view in FIG. 6A showing an open state in the display-content control switching or product-specification switching section in the switch member.

When considering a variety of product development or OEM supply, there is change of display content on a display device as one of simple and effective methods. In this case, in order to switch a display-content control signal in an integrated circuit 2, on a circuit board 1 as shown in FIG. 3 a pattern corresponding to display-content switching is shorted (see FIG. 4A) or made open (see FIG. 4B) by soldering or attaching a switch member 7 and switching the same (see FIG. 6A and FIG. 6B). Furthermore, adopted is a method of switching by shorting (see FIG. 5A) or making open (see FIG. 5B) a terminal in wire bonding.

In the conventional art, there has been disadvantage that electronic circuits mounting an integrated circuit 2 have to be manufactured and controlled that are difficult to identify at a glance and slight in difference such as a presence or absence of soldering or short or open in wire bonding despite the same in circuit configuration.

Also, there has been disadvantage that, when the wire bonding is shorted or open, the wire itself is hidden by a seal member 6 and invisible and mistakes in the manufacture process are impossible to correct.

Furthermore, in the case of short or open due to soldering and switching action using a switch member 7, in the recent circuit design aiming at high density design with high integration, its solder pattern 1b and switch member 7 are large in size and occupy a large surface area in the circuit board 1 resulting in bottleneck upon pattern interconnection.

SUMMARY OF THE INVENTION

In order to solve the foregoing problem, in the present invention, as shown in FIG. 1 and FIG. 2, the terminals 2a for a display content control signal or product specification control signal of an integrated circuit 2 are all connected to a corresponding pattern 1c of a circuit board 1. A display content control signal or product specification control signal pattern 1d is provided together in a display device drive signal pattern 1a for input to the display device 3 or display device 4 through a connection member 5 such as a connector. With this arrangement, a plurality of kinds of electronic circuits mounting integrated circuits 2 are not required to manufacture/manage. A soldering pattern 1b (see FIG. 4A, FIG. 4B) or switch member 7 (see FIG. 6A, FIG. 6B) for display content switching or product specification switching is excluded from the circuit board 1.

The display content control signal or product specification control signal inputted to the display device 3 or display device 4 through the above route is, in the pattern interconnection in the display device 3 or display device 4 prepared on the basis of each destination, a certain one is formed with a state that the display content control signal or product specification control signal is shorted (see FIG. 1) and another certain one with a state that the display content control signal or product specification control signal is open (see FIG. 2), thereby making possible to provide a display content switch section or product specification switch section within the display device 3 or display device 4.

BRIEF DESCRIPTION OF THE DRAWINGS

A preferred form of the present invention is illustrated in the accompanying drawings in which.

DETAILED DESCRIPTION OF THE PREFERRED EMBODIMENTS

The present invention is structured, as shown in FIG. 1 and FIG. 2, that on a circuit board 1 a display content control signal or product specification control signal connected from an integrated circuit 2 is provided together in a display device drive signal pattern 1a. The display content control signal or product specification control signal is inputted through a connecting member 5 such as a connector to a display device 3 or display device 4. The display content control signal or product specification control signal inputted to the display device 3 or display device 4, in certain one forms a state shorted in the display content control signal or product specification control signal (FIG. 1) and in certain another one a state open in the display content control signal or product specification control signal (FIG. 2) by a pattern interconnection in the display device 3 or display device 4 prepared on the basis of each destination.

An embodiment will be explained with reference to the drawings. FIG. 1 shows a lateral type display device having a display format comprised of a plurality of seven-segment display elements in a fixed arrangement to display time and date content in a lateral or right-to-left orientation. A display content control signal connected from an integrated circuit 2 mounted on a circuit board 1 is input to the lateral type display device 3 through a connecting member 5 such as a connector provided in parallel with a display device drive signal pattern la by a pattern interconnection 1d of the circuit board 1. The display content control signal input to the lateral type display device 3 recognizes that a pattern interconnection in the lateral type display device 3 is shorted 3a, and a display device drive signal driving the lateral type display device 3 is output from the integrated circuit 2 to normally drive the lateral type display device 3.

FIG. 2 shows a vertical type display device having a different display format from that of FIG. 1 and comprised of a plurality of dot matrix display elements in a fixed arrangement to display time and date content in a vertical orientation. A display content control signal connected from an integrated circuit 2 mounted on a circuit board 1 is input to the vertical type display device 4 through a connecting member 5 such as a connector provided in parallel with a display device drive signal pattern la by a pattern interconnection 1d of the circuit board 1. The display content control signal input to the vertical type display device 4 recognizes that a pattern interconnection in the vertical type display device 4 is open 4a, and a display device drive signal driving the vertical type display device 4 is output from the integrated circuit 2 to normally drive the vertical type display device 4.

Figure 7:
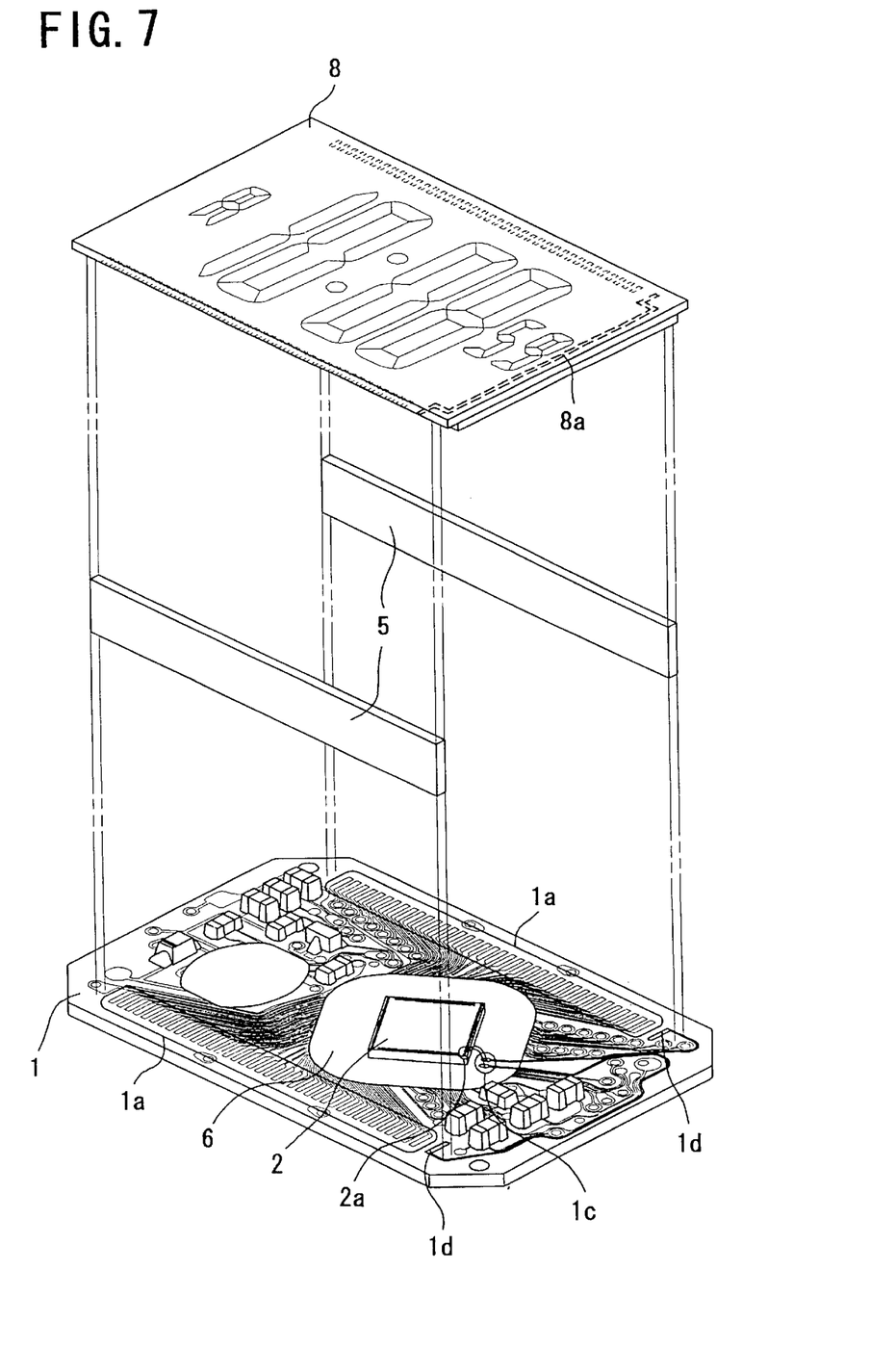
FIG. 7 is a perspective view representing an overall separation structure of a display device for an electronic appliance when mounting a lateral type display device for a single-function digital timepiece according to the present invention.

Also, in FIG. 7 showing a display device for a single-function digital timepiece, a product-specification control signal connected from an integrated circuit 2 mounted on a circuit board 1 recognizes, through a connecting member 5 such as a connector provided parallel with a display-device drive signal pattern 1a by a pattern interconnection 1d of the circuit board 1, that the pattern interconnection in the display device for a single-function digital timepiece 8 is shorted 8a, and a product-specification control signal driving the display device for a single-function digital timepiece 8 is outputted from the integrated circuit 2, normally functioning as a single-function digital timepiece mounting only the timepiece function.

Figure 8:
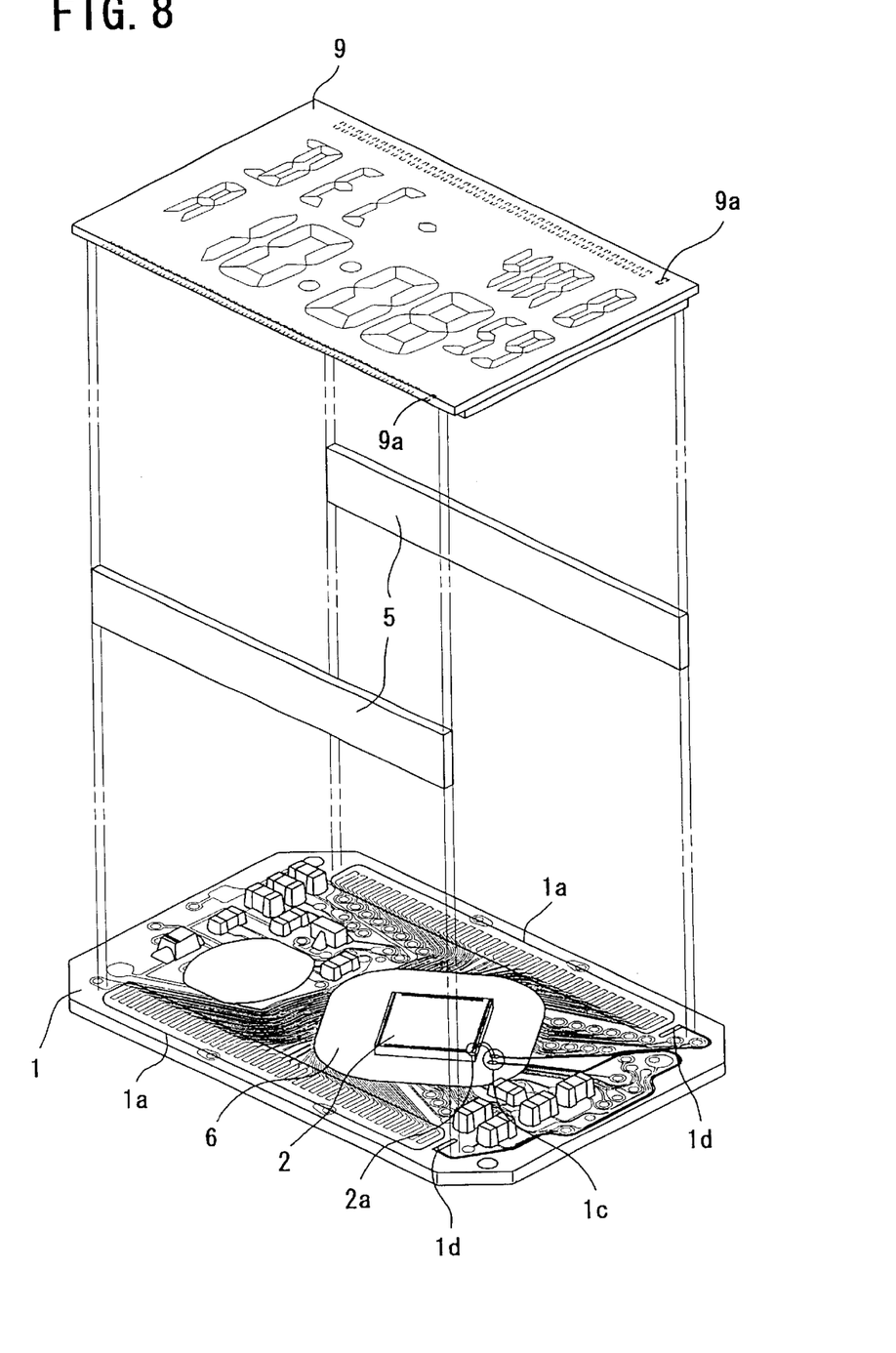
FIG. 8 is a perspective view representing an overall separation structure of a display device for an electronic appliance when mounting a lateral type display device for a multi-function digital timepiece according to the present invention.

Also, in FIG. 8 showing a display device for a multi-function digital timepiece, a product-specification control signal connected from an integrated circuit 2 mounted on a circuit board 1 recognizes, through a connecting member 5 such as a connector provided parallel with a display-device drive signal pattern 1a by a pattern interconnection 1d of the circuit board 1, that the pattern interconnection in the display device for a single-function digital timepiece 9 is open 9a, and a product-specification control signal driving the display device for a multi-function digital timepiece 9 is outputted from the integrated circuit 2, normally functioning as a multi-function digital timepiece mounting the functions for alarm, chronograph, timer and the like besides timepiece.

The present invention is practiced in the forms as explained above and has the effects as described below.

(1) By structuring a display-content switching section or product-specification switching section within the display device 3 or display device 4, a soldering pattern 1b and switch member 7 for display-content switching or product-specification switching are excluded from the circuit board 1, enabling high density design with high integration.

(2) There is no necessity of manufacturing/controlling a plurality of electronic circuits mounting integrated circuits 2 difficult to identify at a glance and slight in difference such as short or open due to wire bonding or short or open due to soldering pattern 1b.

(3) Because of unnecessity of switching action such as short or open due to wire bonding or short or open due to soldering pattern, it is possible to reduce in-process badness such as incorrect specification due to mistake in the manufacture process.

(4) By merely remounting the display device 3 or display device 4 itself, urgent change of destination or the like such as in OEM supply can be coped with because of no necessity of switching a display-content control signal or product-specification control signal on the electronic circuit mounting the integrated circuit 2.

What is claimed is:

1. A display device for an electronic appliance, comprising:
   a circuit board;
   a display panel mountable on the circuit board and having a plurality of display elements in a given fixed arrangement, and a circuit pattern that indicates a display format of the display panel, the display format defining at least one of the type of the display elements, or the fixed arrangement of the display elements, or content displayable by the display panel; and
   an integrated circuit mounted to the circuit board for detecting the display format of the display panel by outputting a display content control signal to the display panel, and for driving the display panel according to the detected display format;
   wherein the integrated circuit outputs the display content control signal to the circuit pattern and detects the display format of the display panel in accordance with the circuit pattern, so that display panels having different display formats each having a different type of display elements, or a different fixed arrangement of display elements or being capable of displaying different content are mountable to the circuit board and the display format of a respective display panel is detected when the respective display panel is mounted to the circuit board.

2. A display device for an electronic appliance according to claim 1; wherein a plurality of different display panels each having a unique display format are prepared for use in different destinations, and the circuit pattern on the display panel indicates the destination.

3. A display device for an electronic appliance according to claim 1; wherein the circuit pattern presents an open circuit to the display content control signal to indicate a first display format and presents a closed circuit to the display content control signal to indicate a second display format.

4. A display device for an electronic appliance according to claim 1; wherein the circuit board has a drive signal circuit pattern formed thereon for supplying drive signals from the integrated circuit to the display panel, and the display content control signal is output to the display panel through the drive signal circuit pattern.

5. A display device for an electronic appliance according to claim 4; further comprising a connector mounted to the circuit board for mounting the display panel thereto, the connector having a circuit pattern for conveying the drive signals and the display content control signal from the integrated circuit to the display panel.

6. A display device for an electronic appliance according to claim 1; wherein the display panel is a rectangular-shaped display panel for displaying the content in a lateral orientation.

7. A display device for an electronic appliance according to claim 6; wherein the content comprises time and date information.

8. A display device for an electronic appliance according to claim 1; wherein the display panel is a rectangular-shaped display panel for displaying the content in a vertical orientation.

9. A display device for an electronic appliance according to claim 8; wherein the content comprises time and date information.

10. A display device for an electronic appliance according to claim 1; wherein the display elements are seven-segment display elements.

11. A display device for an electronic appliance according to claim 1; wherein the display elements are dot-matrix display elements.

12. A display device for an electronic appliance comprising:

a circuit board;

a display panel mountable on the circuit board and having a plurality of display elements in a given fixed arrangement, and a circuit pattern that indicates a display format of the display panel, the display format defining at least one of the type of the display elements, or the fixed arrangement of the display elements, or content displayable by the display panel; and an integrated circuit mounted to the circuit board for detecting the display format of the display panel by outputting a product specification control signal to the display panel, and for driving the display panel in accordance with the detected display format;

wherein the integrated circuit outputs the product specification control signal to the circuit pattern and detects the display format of the display panel in accordance with the circuit pattern, so that display panels having different display formats each having a different type of display elements, or a different fixed arrangement of display elements or being capable of displaying different content are mountable to the circuit board and the display format of a respective display panel is detected when the respective display panel is mounted to the circuit board.

13. A display device for an electronic appliance according to claim 12; wherein a plurality of different display panels each having a unique display format are prepared for use in different destinations, and the circuit pattern on the display panel indicates the destination.

14. A display device for an electronic appliance according to claim 12; wherein the circuit pattern presents an open circuit to the product specification control signal to indicate a first display format and presents a closed circuit to the product specification control signal to indicate a second display format.

15. A display device for an electronic appliance according to claim 12; wherein the circuit board has a drive signal circuit pattern formed thereon for supplying drive signals from the integrated circuit to the display panel, and the product specification content control signal is output to the display panel through the drive signal circuit pattern.

16. A display device for an electronic appliance according to claim 15; further comprising a connector mounted to the circuit board for mounting the display panel thereto, the connector having a circuit pattern for conveying the drive signals and the product specification content control signal from the integrated circuit to the display panel.

17. A display device for an electronic appliance according to claim 12; wherein the display panel is a rectangular-shaped display panel for displaying the content in a lateral orientation.

18. A display device for an electronic appliance according to claim 17; wherein the content comprises time and date information.

19. A display device for an electronic appliance according to claim 12; wherein the display panel is a rectangular-shaped display panel for displaying the content in a vertical orientation.

20. A display device for an electronic appliance according to claim 19; wherein the content comprises time and date information.

21. A display device for an electronic appliance according to claim 12; wherein the display elements are seven-segment display elements.

22. A display device for an electronic appliance according to claim 12; wherein the display elements are dot-matrix display elements.

23. A display device drive circuit comprising: a circuit board; an integrated circuit mounted to the circuit board for outputting a detecting signal for detecting a display format of one of a plurality of different types of display panels each having a unique display format, each display format having a different fixed arrangement of display elements or being capable of displaying different content, the display format of the display panel being indicated by a first circuit pattern formed on the display panel when the one display panel is mounted on the circuit board and for outputting drive signals for driving the one display panel according to the detected display type; and a second circuit pattern formed on the circuit board and connected to the integrated circuit and connectable to the first circuit pattern for conveying the detecting signal and the drive signals to the one display panel.

24. A display device drive circuit according to claim 11, wherein the plurality of different types of display panels each having a unique display format are prepared for use in different destinations, and the first circuit pattern formed on the display panels indicates the destination.

25. A display device drive circuit according to claim 23; wherein the first circuit pattern presents an open circuit to the detecting signal to indicate a first display format and presents a closed circuit to the detecting signal to indicate a second display format.

26. A display device drive circuit according to claim 23; further comprising a connector mounted to the circuit board for mounting the display panel thereto, the connector having a third circuit pattern for conveying the detecting signal and the drive signals from the integrated circuit to the display panel.

27. A display device drive circuit according to claim 23; wherein the one display panel is a rectangular-shaped display panel for displaying the content in a lateral orientation.

28. A display device for an electronic appliance according to claim 27; wherein the content comprises time and date information.

29. A display device drive circuit according to claim 23; wherein the one display panel is a rectangular-shaped display panel for displaying the content in a vertical orientation.

30. A display device for an electronic appliance according to claim 29; wherein the content comprises time and date information.

31. A display device drive circuit according to claim 23; wherein the display elements are seven-segment display elements.

32. A display device drive circuit according to claim 23; wherein the display elements are dot-matrix display elements.

\* \* \* \* \*